United States Patent [19]

Nolan et al.

[11] Patent Number: 4,780,750
[45] Date of Patent: Oct. 25, 1988

[54] ELECTRICALLY ALTERABLE NON-VOLATILE MEMORY DEVICE

[75] Inventors: Joseph G. Nolan; Michael A. Van Buskirk; Te-Long Chiu, all of San Jose; Ying K. Shum, Cupertino, all of Calif.

[73] Assignee: Sierra Semiconductor Corporation, San Jose, Calif.

[21] Appl. No.: 815,869

[22] Filed: Jan. 3, 1986

[51] Int. Cl.[4] .......................................... H01L 29/78
[52] U.S. Cl. ...................... 357/23.5; 357/23.6; 357/12; 357/41; 357/54; 365/185
[58] Field of Search .............. 357/23.5, 12, 41, 54, 357/23.6; 365/185

[56] References Cited

U.S. PATENT DOCUMENTS

| 4,477,825 | 10/1984 | Yaron et al. | 357/23.5 |
| 4,477,883 | 10/1984 | Wada | 365/185 |
| 4,513,397 | 4/1985 | Ipri et al. | 365/185 |
| 4,527,255 | 7/1985 | Kestboe | 365/185 |
| 4,527,259 | 7/1985 | Watanabe | 365/185 |
| 4,571,704 | 2/1986 | Bohac | 365/185 |
| 4,571,705 | 2/1986 | Wada | 357/23.5 |
| 4,611,309 | 9/1986 | Chuang et al. | 365/185 |
| 4,685,083 | 8/1987 | Leuschner | 365/185 |

Primary Examiner—Joseph E. Clawson, Jr.
Attorney, Agent, or Firm—Limbach, Limbach & Sutton

[57] ABSTRACT

In this invention, an Electrically Alterable Non-Volatile Memory (EANOM) cell is disclosed. The EANOM cell comprises an MOS transistor, having a source, a gate and a drain. The EANOM cell also has a two-terminal tunnel device, one end of which is connected to the gate of the MOS transistor. The other terminal being labelled "T". The tunnel device causes charges to be stored or removed from the gate of the MOS transistor. In a preferred embodiment, a four-terminal EANOM cell is disclosed. The four terminals of the EANOM cell are terminals T, S (source of the MOS transistor), D (drain of the MOS transistor) and a terminal C which is capacitively coupled to the gate of the MOS transistor. The EANOM cell can be used in a memory circuit to increase the reliability thereof. Two or more EANOM cells are connected in tandem and operate simultaneously. Catastrophic failure of one EANOM cell results in an open circuit with the other EANOM cell continuing to function.

6 Claims, 6 Drawing Sheets

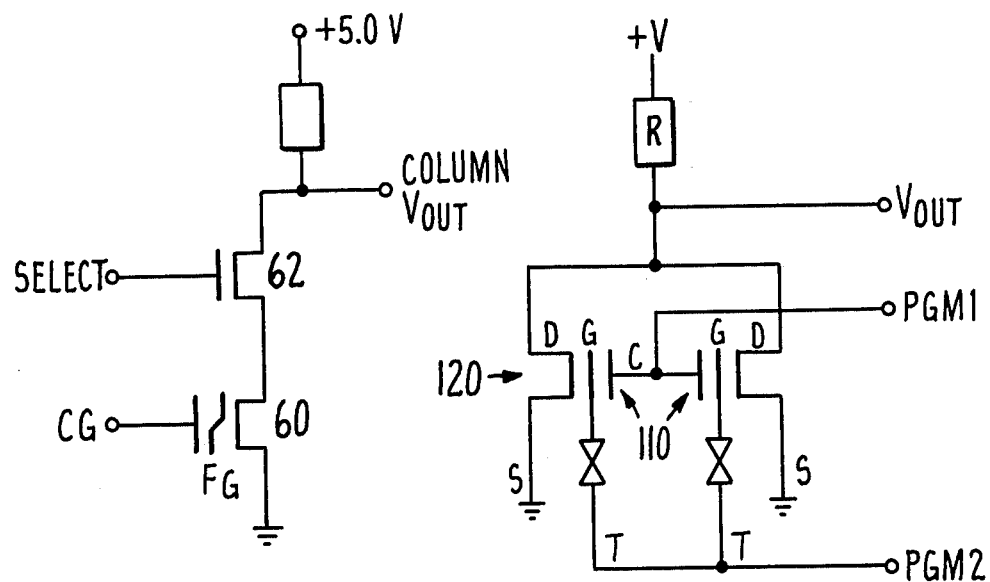
FIG. 5
FIG. 6
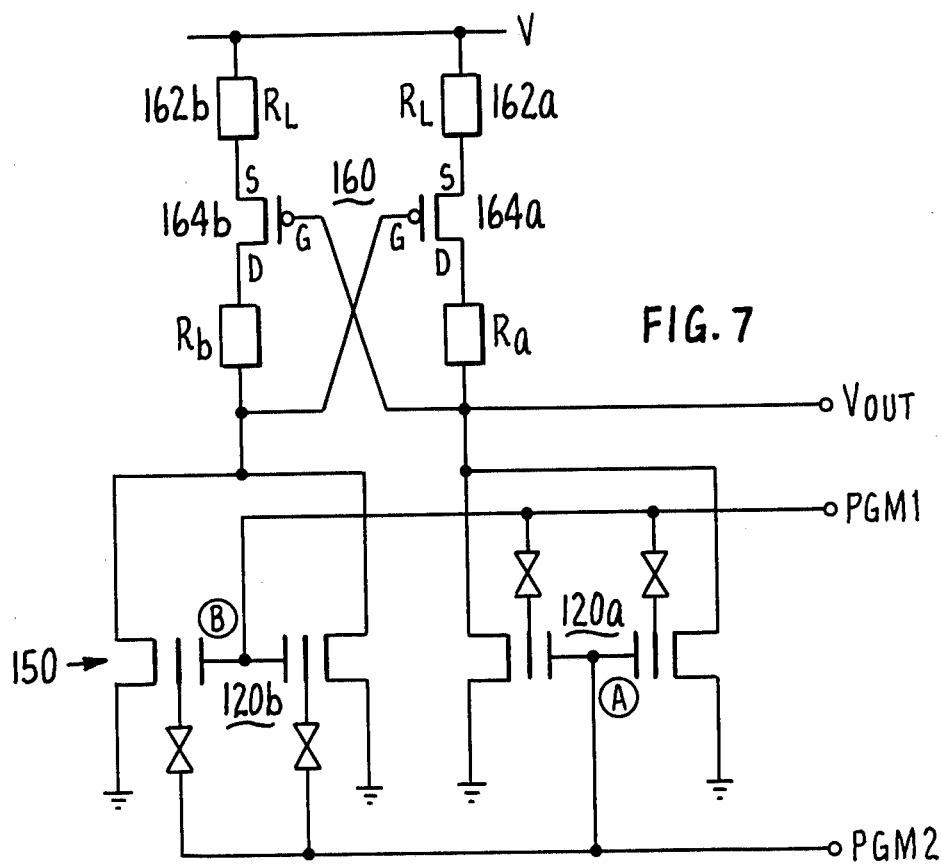
FIG. 7

ELECTRICALLY ALTERABLE NON-VOLATILE MEMORY DEVICE

BACKGROUND OF THE INVENTION

The present invention relates to an electrically alterable non-volatile memory and, more particularly, to a three-terminal electrically programmable memory cell and a circuit using said cell, having high-reliability.

TECNICAL DESCRIPTION

Electrically alterable non-volatile memory devices are well-known in the prior art. A typical device is an Electrically Programmable Read-Only Memory (EPROM). An EPROM transistor is a three-terminal transistor in which the terminals are called the gate, the drain, and the source. An EPROM transistor is made out of MOS technology. Within an EPROM transistor is a floating gate on which charges are stored. The floating gate is deposited on an insulative layer which separates the gate from the semiconductive substrate. If the floating gate is neutral, i.e., no charge is stored on the floating gate, current will conduct from the drain to the source or vice versa depending on the polarity of the carrier in the channel between the drain and the source. If charges are stored on the floating gate, then the charged floating gate would inhibit current flow between the drain and the source. The removal of charges from the floating gate in an EPROM transistor is done by applying UV or ultra-violet light to the array of EPROM transistors (typically, a plurality of EPROM transistors are fabricated from a single semiconductive substrate forming an array of EPROM transistors). The placement of electrical charges on the floating gates of selective EPROM transistors is accomplished by applying a high voltage to the gate terminal and a high voltage to the drain, causing electrons to migrate from the source to the floating gate. Electrons are injected onto the floating gate by the mechanism of hot electron injection. Thus, once an EPROM device (an array of EPROM transistors) has been subjected to ultra-violet light application, all charges are removed from all of the floating gates of EPROM transistors. The application of high voltage to specific EPROM transistors would cause selective floating gates to be charged and, thus, slective EPROM transistors would store representations of data.

Another typical prior art electrically alterable non-volatile memory cell is the Electrically Erasable Programmable Read-Only Memory (EEPROM). An EEPROM transistor is very similar to an EPROM transistor in that it is a three-terminal device, having a gate, a drain and a source. The EEPROM transistor also has a floating gate. However, the floating gate in an EEPROM transistor has a portion of it insulated from the semi-conductive substrate by a layer of dielectric less than approximately 200 angstroms in thickness and is generally disposed over the drain region. Electrons are placed and removed from the floating gate from the drain region through the thin dielectric by the mechanism of Fowler-Nordheim tunneling. To program an array of EEPROM transistors, all of the floating gates of each of the EEPROM transistor are first charged. That is, all of the EEPROM transistors are activated to cause the electrons from the drain region to move to the floating gate. This is accomplished by placing a high potential at the gate terminal, a ground or zero potential at the source and at the drain. Thereafter, selective EEPROM transistors are discharged, i.e., electrons from the floating gate of selective transistors are removed. This is accomplished by applying high voltage to the drain region of the selective EEPROM transistors and ground potential to the gate terminal of the selective EEPROM transistors.

MOS transistors are also well-known in the art. MOS transistors can be enhancement-type, as well as depletion-type. In an enhancement-type MOS transistor, a potential must be applied to the gate of the transistor to cause conduction of current from the drain to the source. MOS transistors can be made into either P channel type or N channel type.

In U.S. Pat. No. 4,203,158, an EEPROM transistor is disclosed. In this reference, there is dsclosed a third region in the semi-conductuve substrate, other than the source and the drain, over which is disposed the floating gate. The MOS transistor disclosed in this reference is generally of the EEPROM-type, i.e., there being three terminals and conduction of current between the source and the drain occurs when electrons are removed from the floating gate. Other references which disclose an electrically programmable and erasable memory cell can be found in U.S. Pat. No. 4,132,904; 4,477,825; and 4,274,012. In addition, reference is made to an article entitled "A New Flash EEPROM Cell Using Triple Polysilicon Technology" by Fujio Masuka, et al., dated December 1984, published in 1984 IEDM Proceedings, pages 464–467.

SUMMARY OF THE INVENTION

In the present invention, a three-terminal electrically alterable non-volatile memory circuit is disclosed. The circuit comprises an MOS transistor having a drain, a source, and a gate. A first terminal is connected to the drain. A second terminal is connected to the source. A programming means for tunnelling charges has two terminals. One of the two terminals of the programming means is electrically connected to the gate of the MOS transistor. A third terminal is connected to the other terminal of the programming means.

BRIEF DESCRIPTION OF THE DRAWINGS

FIGS. 4a-1-3, and 4b-1-3, 4c-1-3 and 4d-1-4 are topological and cross-sectional views of various embodiments of the electrically alterable non-volatile memory cell, as schematically depicted in FIGS. 3a and 3b.

FIG. 5 is a schematic circuit diagram of one use of an EEPROM transistor of the prior art.

FIG. 6 is a high-reliability memory circuit employing two electrically alterable non-volatile memory cell of the present invention.

FIG. 7 is a schematic circuit diagram of a high-reliability, low-power memory circuit employing four electrically alterable non-volatile cells of the present invention.

DETAILED DESCRIPTION OF THE DRAWINGS

Figure 1:
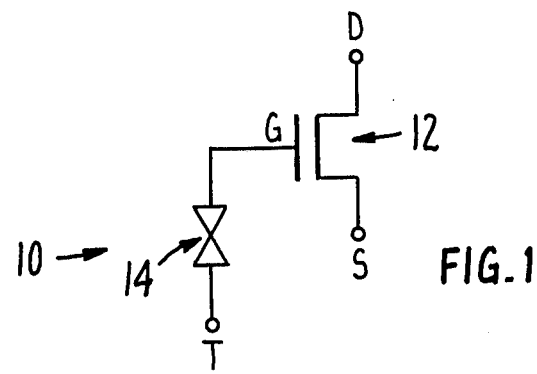
FIG. 1 is a schematic circuit diagram of an electrically alterable non-volatile memory cell of the present invention.

Referring to FIG. 1, there is shown a schematic circuit diagram of an Electrically Alterable Non-Volatile Memory (EANOM) cell 10 of the present invention. The EANOM cell 10 is a three-terminal device comprising a MOS transistor 12 and a tunnel device 14. The MOS transistor 12 comprises a drain (D), a gate (G) and a source (S). The MOS transistor 12 is of conventional design. The tunnel device 14 is a two-terminal device comprising a tunnel oxide and a terminal, which is connected to the gate (G) of the MOS transistor 12, and another terminal (T). Thus, the three terminals of the EANOM cell 10 of the present invention comprises a first terminal D connected to the drain of the MOS transistor 12, a second terminal S connected to the source of the MOS transistor 12, a third terminal T connected to the tunnel device 14, with the gate G of the MOS transister 12 connected to the other terminal of the tunnel device 14.

Figure 2:
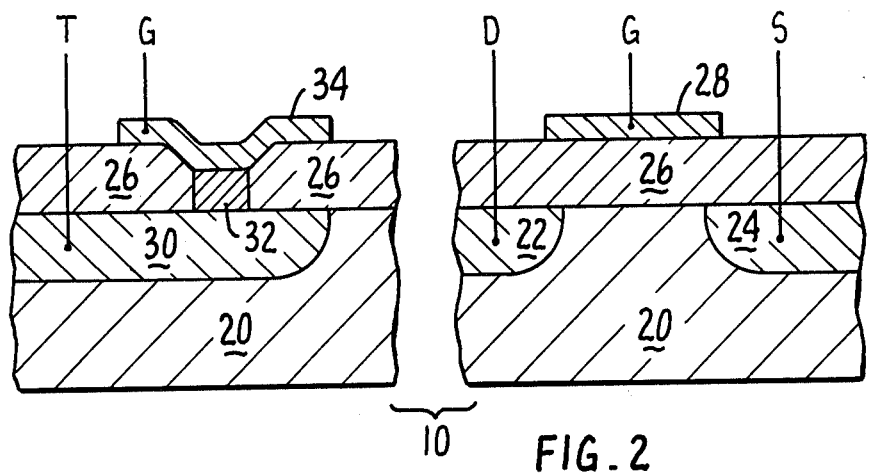
FIG. 2 is a cross-sectional view of the embodiment of the electrically alterable non-volatile memory cell of the present invention, shown in FIG. 1.

Referring FIG. 2, there is shown a cross-sectional view of the EANOM cell 10 of the present invention. The EANOM cell 10 comprises the MOS transistor 12 and the tunnel device 14. The MOS transistor 12 is made from a semi-conductive substrate 20 of a first conductivity type, such as P type. Thus, an N channel is formed. A first region 22 of a second conductivity type, such as N+ is formed in the substrate 20. A second region 24, spaced apart from the first region 22, is of the second conductivity type, i.e., N+. A first terminal is connected to the first region 22 and forms the D terminal to the EANOM cell 10. A second terminal is connected to the second region 24 and forms the source (S). As is well-known in MOS transistor technology, the surface of the semi-conductive substrate 20 between the first region 22 and the second region 24 is the channel of the MOS transistor 12. A first insulative layer 26, such as silicon dioxide, is grown over the semi-conductive substrate 20. A first electrically conductive layer 28 such as a polysilicon layer is deposited on the first insulative layer 26 and forms the gate terminal G.

The tunnel device 14 can be fabricated from the same semi-conductive substrate 20 as the semi-conductive substrate 20 used to fabricate the MOS transistor 12. A third region 30 of the second conductivity type is formed in the semi-conductive substrate 20. The terminal T is connected thereto. A second insulative layer 32, which can be the same type as the first insulative layer 26, such as silicon dioxide, is grown on a selected region of layer 30. A polysilicon layer 34 is deposited on the second insulative layer 32. The second polysilicon layer 34 can be the continuation of the first polysilicon 28, thereby forming the electrical connection between the terminal G of device 14 and the gate G of the MOS transistor 12.

In the preferred embodiment, the MOS transistor 12 is an MOS transistor of the enhancement type and, more particularly, of the N-channel type. The advantage of having an enhancement-type MOS transistor 12 will be discussed later. The advantage of an N-channel type MOS transistor 12 is that, in general, an N-channel type transistor has the advantage of higher frequency response and greater switching speed. This is due to the higher mobility of electrons which conduct from the source through the channel to the drain, rather than P-type transistors which use holes to conduct from drain to the source.

The third region 30 of the tunnel device 14 can be N+ doping of arsenic, buried deep in the region 30. The second insulative layer 32 in the region immediately over the third region 30 is preferably less than 200 angstroms. Thus, electrons can conduct from the third region 30 to the second polysilicon layer 34 by tunneling through the second insulative layer 32 based upon the Fowler-Nordheim Principle.

The programming of the EANOM cell 10 of the present invention is accomplished by putting a voltage potential between terminal T and terminal G. The application of a high potential voltage (on the order of 7–15 volts) causes charges to be added or removed from the second polysilicon layer 34 through the thin oxide layer of the second insulative layer 32 over the third region 30. This is due to the tunneling of the electrons by the Fowler-Nordheim mechanism. Thus, the tunnel device 14 is the programming means by which charges (both positive and negative) are added to or taken off from the gate G. The potential to terminal G must be applied through capacitive coupling. This is accomplished by connecting terminal T to ground; terminal S is held floating; and terminal D is connected to a high potential (on the order of at least 10–20 volts). The capacitance of gate G to drain D is made large enough to provide the necessary capacitive coupling.

After programming, the terminal G is held at a floating state; i.e., not connected to any potential. Thus, the charges on the gate G remain on the first conductive layer 28 and affect the conductivity of MOS transistor 12. During the read state, the amount of current flowing from the source S to drain D determine the logical state of the EANOM cell 10.

Figure 3A:
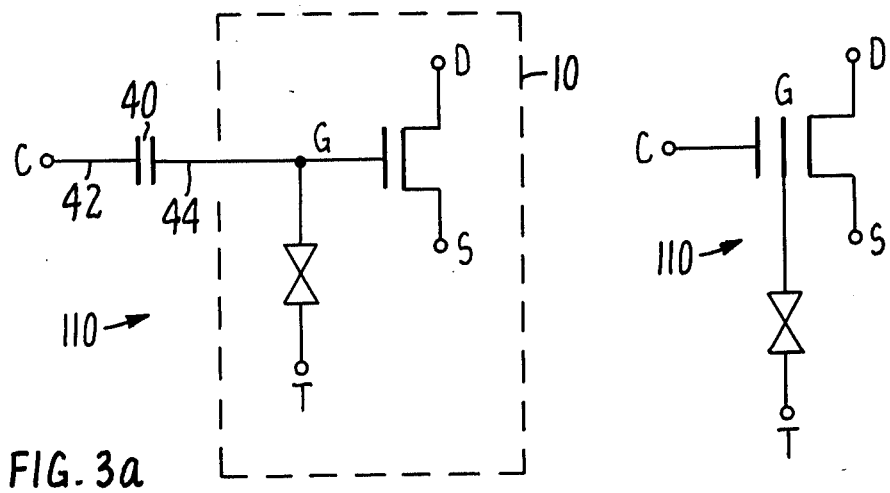
FIGS. 3a and 3b are schematic diagrams of another embodiment of the electrically alterable non-volatile memory cell of the present invention.
Figure 3B:
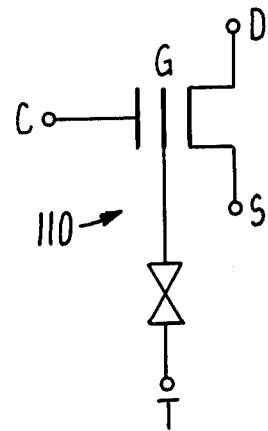

Referring to FIGS. 3a and 3b, there is shown another schematic embodiment, which is the preferred embodiment, of the EANOM cell 110 of the present invention. The EANOM cell 110 is a four-terminal cell and comprises the EANOM cell 10 as shown and as described in FIG. 1. In addition, a capacitor 40 having two terminals, 42 and 44, are connected to the terminal G of the EANOM cell 10 of the present invention and the drain to gate capacitance is made small, as capacitor 40 provides coupling. The second terminal 44 is connected to the terminal G of the EANOM cell 10 with the first terminal 42 being the terminal C of the EANOM cell 110. Schematically, the electrical connection is shown in FIG. 3b. Although schematically, the EANOM cell 110, shown in FIG. 3b, has some similarity to an EPROM transistor, i.e., there being a drain D, a source S, a control gate C and a "floating gate" G, there is no terminal T in an EPROM transistor. Further, it should be emphasized that this is only a schematic representation and that the EANOM cell 110 is not comprised in part of an EPROM transistor.

Figure 4A:
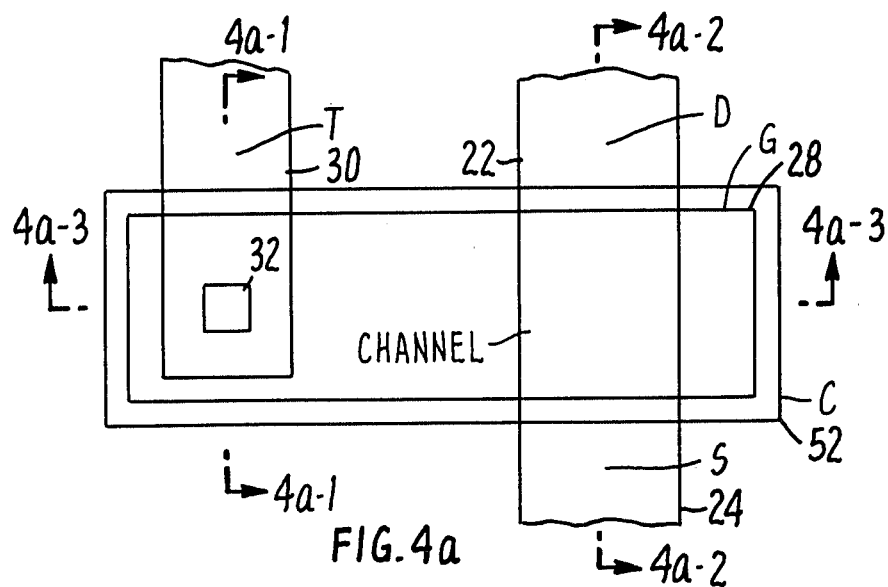
Figures 1, 2, 4A:
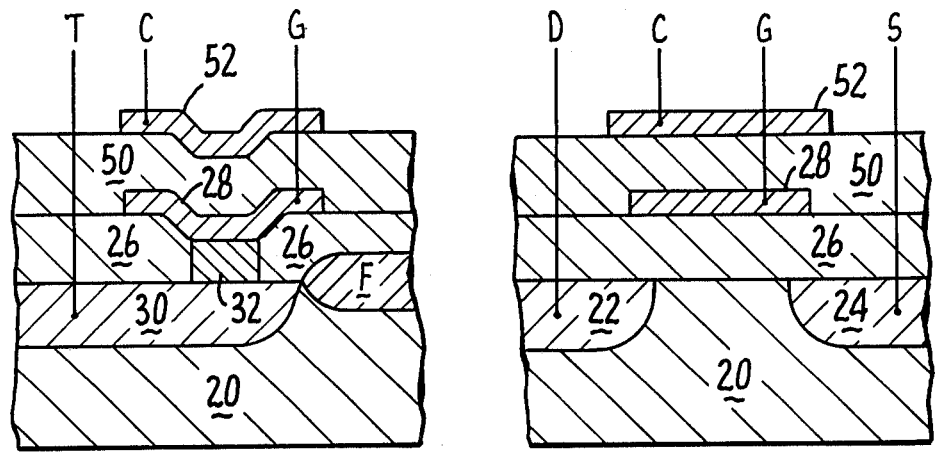
Figures 3, 4A:
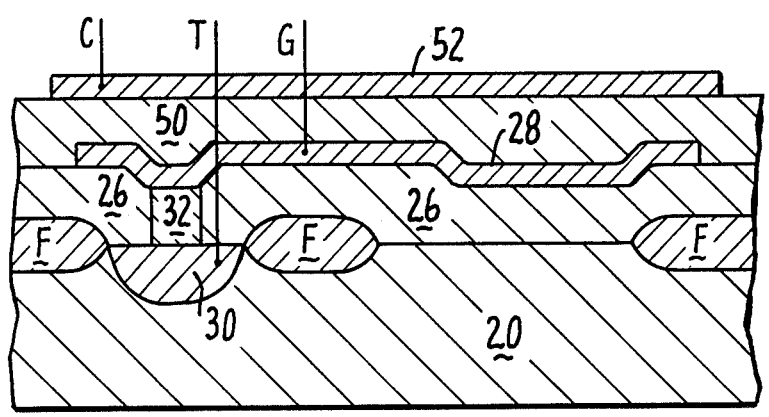

Referring to FIG. 4a, there is shown a topological view of the EANOM cell 110 of the present invention. Various cross-sectional views of the EANOM cell 110 are shown in FIG. 4a-1 through 4a-3. F denotes field oxide.

The EANOM cell 110 comprises a semi-conductive substrate 20 of a first conductivity type, such as P conductivity type. A first region 22, a second region 24, and a third region 30, all spaced apart from one another, are formed in the semi-conductive substrate 20. Each of the regions 22, 24 and 30 are of a second conductivity type. The terminals D, S and T are connected to the first region 22, second region 24 and third region 30, respectively. A first insulative layer 26 is grown on the semiconductive substrate 20 and is generally disposed over the first, second and third regions 22, 24 and 30. The first insulative layer 26 can be a material such as silicon dioxide. Similar to that described for the EANOM cell 10, the thickness of the second insulative layer 32 over a portion of the third region 30 is generally on the order of less than 200 angstroms. A first electrically conductive layer 28 forming the gate G is deposited over the first insulative layer 26 and is also generally disposed over the first, second and third regions, 22 24, and 30, respectively. The first electrically conductive layer 28 can be made of heavily doped polycrystalline silicon. A third insulative layer 50, such as silicon dioxide, is grown or deposited over the first electrically conductive gate 28. A second electrically conductive gate 52 is deposited over the third insulative layer 50 and is generally disposed over the first, second and third regions 22, 24 and 30, respectively. The second electrically conductive gate 52 can also be made from heavily doped polycrystalline silicon. The terminal C is connnected to the second electrically conductive gate 52.

The operation of the EANOM cell 110, shown in FIG. 4a, is similar to the EANOM cell 10, shown in FIG. 2. The only difference between the EANOM cell 110 of FIG. 4a and the EANOM cell 10 of FIG. 2 is the addition of the capacitor 40. The capacitor 40 is formed by the second electrically conductive gate 52 and the first electrically conductive gate 28. Terminal C connected to the second electrically conductive layer 52 couples capacitively to the first electrically conductive gate 28 which is one of the two terminals of the tunnel device 14. The other terminal being terminal T connected to the third region 30. In all other aspects, the MOS transistor 12 is the same as described in FIG. 2.

Figure 4B:
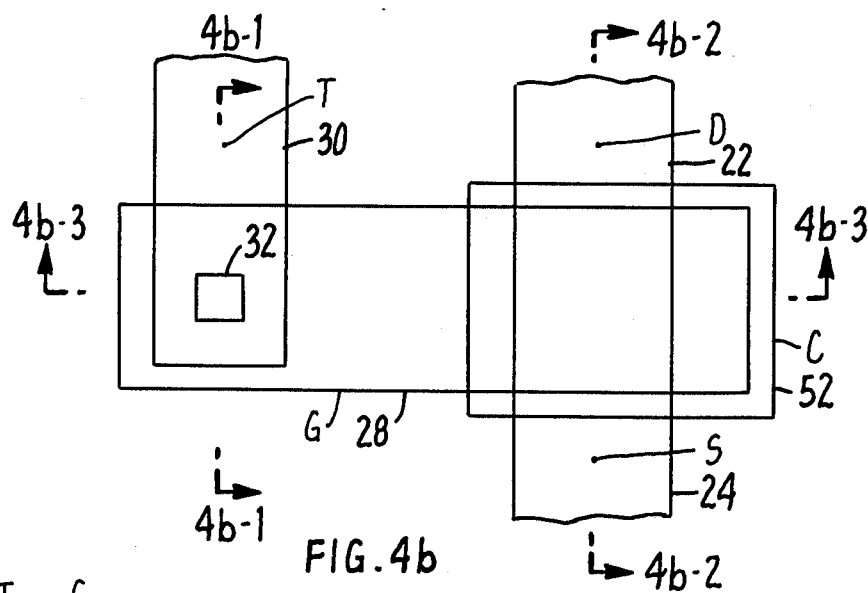
Figures 1, 2, 4B:
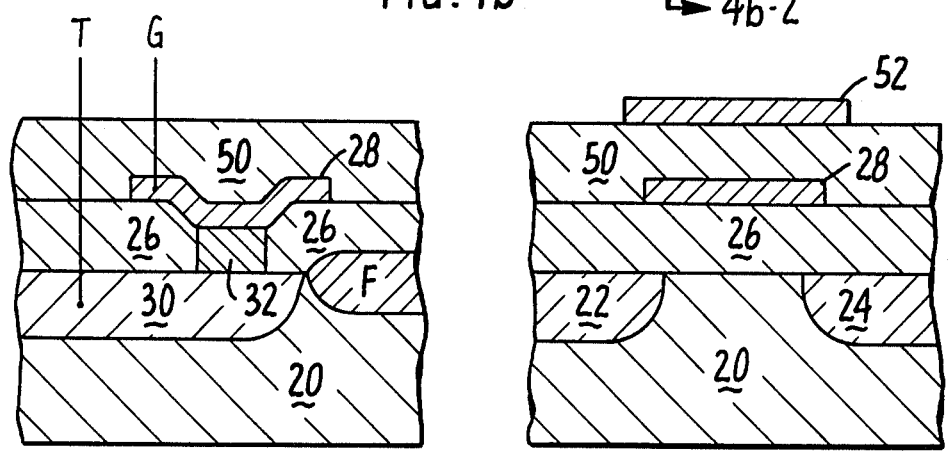
Figures 3, 4B:
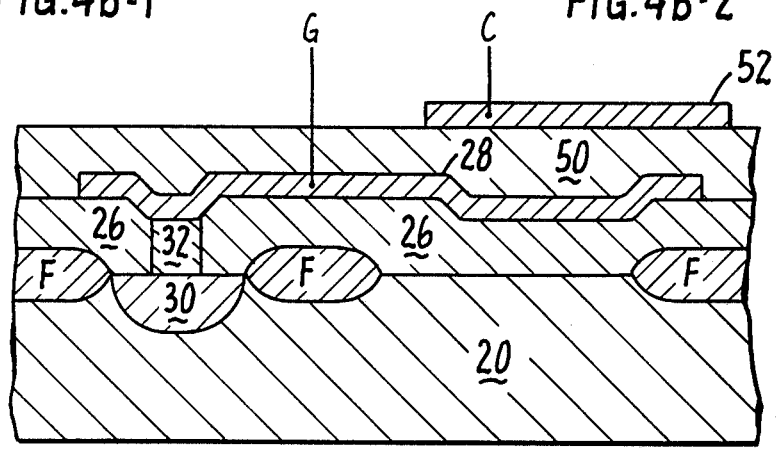

Referring to FIG. 4b, there is shown in topological view another embodiment of the EANOM cell 110 of the present invention. Other cross-sectional views of this embodiment are shown in FIGS. 4b1, 2 and 3. F denotes field oxide region.

In this embodiment, the second electrically conductive gate 52 is deposited on the third insulative layer 50; however, the second electrically conductive gate 52 is generally disposed only over the first and second regions 22 and 24, respectively. However, the application of a voltage to the second electrically conductive gate 52 (terminal C) causes the second electrically conductive gate 52 to be capacitively coupled to the gate G. Since the gate G of the MOS transistor 12 is connected through the first electrically conductive gate 28 to the one terminal of the tunnel device 14, terminal C is capacitively coupled to the tunnel device 14—just like in FIG. 4a.

Figure 4C:
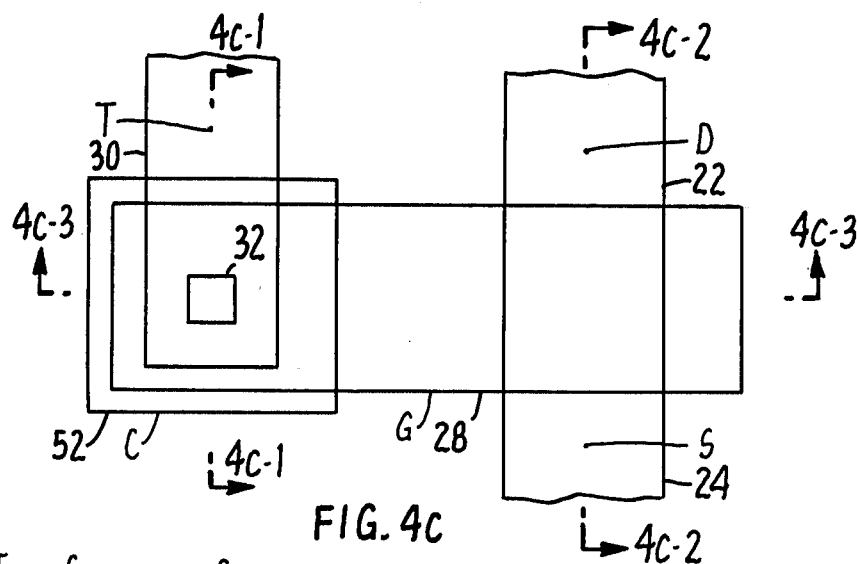
Figures 1, 2, 4C:
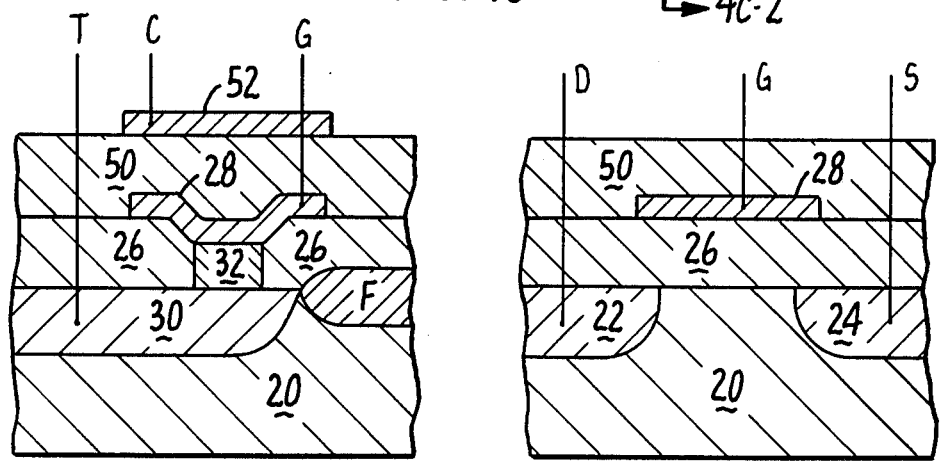
Figures 3, 4C:
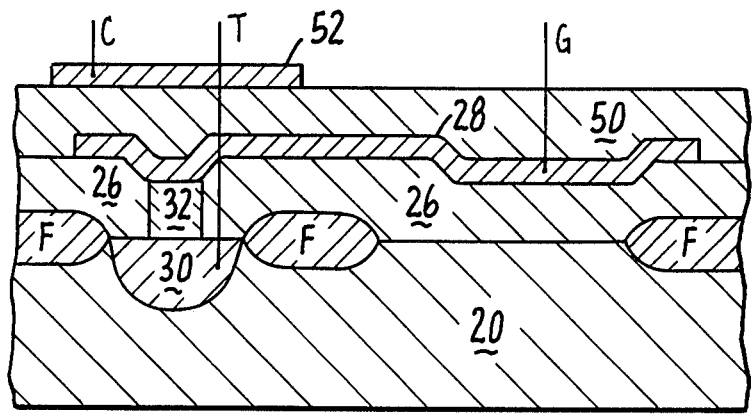

Referring to FIG. 4c, there is shown in topological view another embodiment of the EANOM cell 110 of the present invention. Other cross-sectional views of this embodiment are shown in FIGS. 4c-1, 2 and 3. F denotes field oxide region.

In this embodiment, the second electrically conductive gate 52 is generally disposed over the region 30. Similar to the embodiment shown in FIGS. 4a and 4b, application of voltage to terminal C causes voltage to be capacitively coupled to the first electrically conductive gate 28.

Figure 4D:
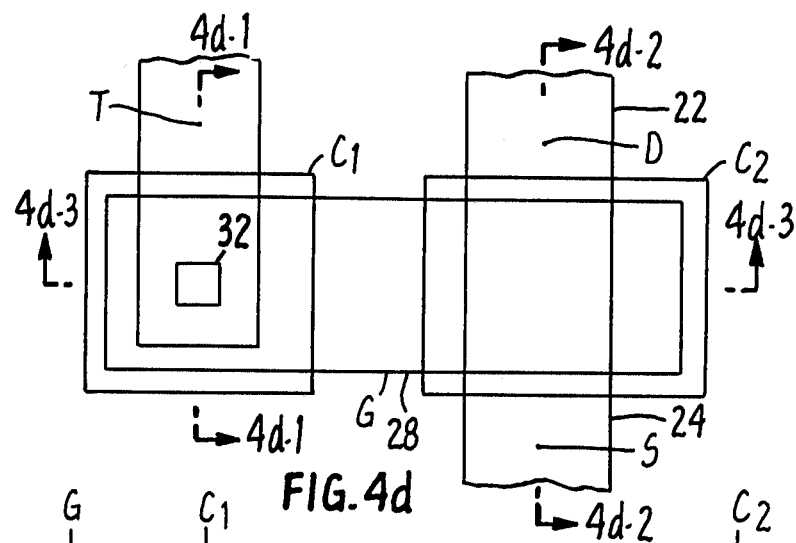
Figures 1, 2, 4D:
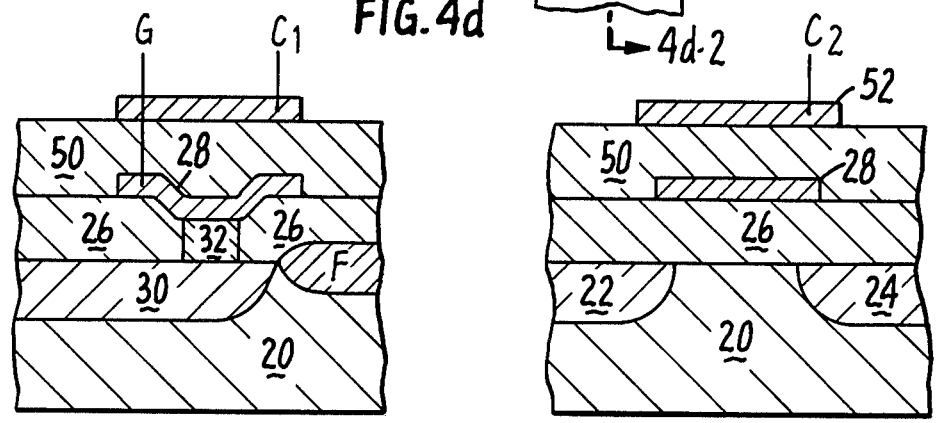
Figures 3, 4D:
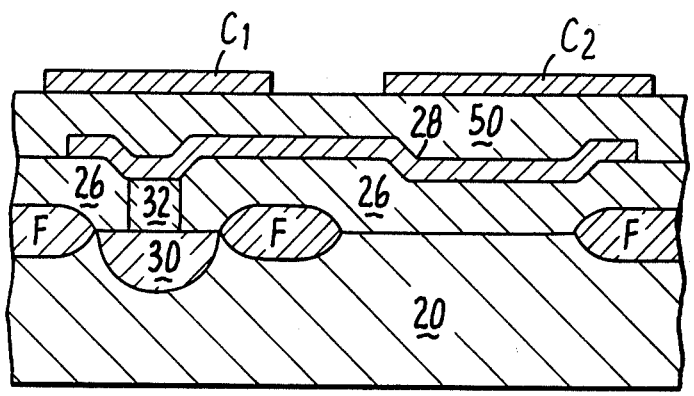
Figures 4, 4D:
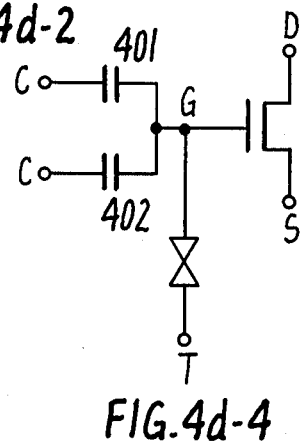

Referring to FIG. 4d, there is shown in topological view another embodiment of the EANOM cell 110 of the present invention. Other cross-sectional views of this embodiment are shown in FIGS. 4d-1, 2 and 3. F denotes field oxide region. In this embodiment, the second electrically conductive gate 52 is disposed in two parts. One part is over first and second regions 22 and 24, and the other over the third region 30. This necessitates the application of two control gate terminals, $C_1$ and $C_2$. A schematic representation of this EANOM cell is shown in FIG. 4d-4.

Capacitors 401 and 402 formed between the first conductive layer 28 and the two parts of the second conductive layer 52 are connected to terminals $C_1$ and $C_2$, respectively. The other capacitor terminals are connected in common to terminal G.

Having two capacitors for coupling to the floating gate G allows for selecting a potential to bias floating gate G which is neither the potential at $C_1$ nor $C_2$, but some voltage which is the result of the capacitor divider between capacitor 401 and capacitor 402. This is particularly useful in a technique for read margining a cell following programming. For example, if read operation was designed to occur with $C_1$ at ground potential and $C_2$ at $V^+$, then to test the margin of conductivity of transistor 12, one could temporarily tie $C_2$ also at ground potential. This would capacitively couple the floating gate G to lower than normal read potential. If the transistor 12 yet conducted adequately, a safety margin has been established which is an indicator of ample positive charge storage on G.

The programming of the EANOM cell 110 is similar to that for the EANOM cell 10. A voltage potential is applied between terminals T and C causing electrons to move through the second insulative layer 32 to or from the third region 30. However, because terminal C is capacitively coupled through capacitor 40—and not directly connected—to the first conductive gate 28, terminals C and T can be connected to a potential, such as ground, after programming without the loss of charge on G.

Referring to FIG. 5, there is shown a memory cell circuit of the prior art using an EEPROM transistor 60. The EEPROM transistor 60 has a gate CG, a floating gate FG, a source S connected to ground potential, and a drain D. Between the drain D and floating gate FG, there is a tunnel oxide area. A select transistor 62 having a gate G, a drain D and a source S is connected to the EEPROM transistor 60 with the source S of the select transistor 62 connected to the drain D of the EEPROM transistor 60. The select transistor 62 and the EEPROM transistor 60 are activiated by a voltage applied to the gate of select transistor 62 and the gate CG of 60. Current can pass through a resistive load R which is connected to the drain of the select transistor 62. At the connection thereof is also the voltage detection for the output of the memory circuit. If electrons are on the floating gate FG of the EEPROM transistor 60, current would not conduct through the drain D and source S of the EEPROM transistor 60 and thus $V_{out}$ would be high. If electrons are removed from the floating gate FG of the EEPROM transistor 60, current would flow from the drain D to the source S of the EEPROM transistor 60. This would cause a voltage drop across the resistive load R bringing $V_{out}$ to a low voltage. Both EEPROM transistor 60 and select transistor 62 are of N channel enhancement type.

The problems of an EEPROM transistor 60 are that electron gain and loss onto the floating gate can occur during the reading of the memory cell shown in FIG. 5. This is because even under read conditions, a minimal voltage, such as 2.5 volts, must be applied to the gate G of the EEPROM transistor 60 while the drain could range from 5 volts to zero volts, thereby causing some charge to be gained or lost from the floating gate, through the tunnel oxide. In addition, EEPROM transistor 60 typically fails by the rupturing of the oxide layer between the floating gate and the drain after a certain number of charge injection and removal cycles. Finally, because of electron trapping in the thin tunnel oxide region between the floating gate and the drain, there is a possibility of low endurance.

Of all the problems associated with an EEPROM transistor 60, the most severe one is that of rupturing of the oxide layer between the floating gate and the drain. This causes the floating gate to be connected to the drain of the semiconductive substrate, thereby preventing the storage of any charges on the floating gate. If the EEPROM transistor 60 is unable to store any charges, the condition would be as if the floating gate had the drain potential on it. Thus, current can flow from the drain to the source. In short, a catastrophic failure would cause the EEPROM transistor 60 to conduct.

Referring to FIG. 6, there is shown a memory circuit 120, using two EANOM cells 110 of the present invention which overcomes the problems mentioned heretofore. The two EANOM cells 110 have the terminals C connected together and are connected to a source of programming voltage labelled "PGM 1". The terminals T of the EANOM cells 110 are connected together and are also connected to a source of programming voltage labelled "PMG 2". The terminal S of each of the EANOM cells 110 are connected to ground potential. The terminal D of each of the EANOM cells 110 are connected together. A voltage source can be applied through a resistance R to the drain of the EANOM cells 110. The output of the memory circuit 120 is at the connection of the drain of the EANOM cells 110 and the resistance R.

In the operation of the memory circuit 120, programming is accomplished by placing high-voltage potential between PGM 1 and PGM 2. If the MOS transistor 12 of each of the EANOM cells 110 is of an N-channel enhancement type and if it is desired to store a negative potential on the gate G of each of the EANOM cells 110, a positive voltage potential is applied to PGM 1 with PGM 2 being grounded. This causes electrons to tunnel from terminal T through the second insulative layer 32 to the gate G. Once programming has finished, PGM 1 and PGM 2 are both held at ground potential. To store a positive potential, the potentials of PGM 1 and PGM 2 are reversed.

In the read condttion, if negative charge is placed on the floating gate G of each of the EANOM cells 110, the MOS transistor 12 of each of the EANOM cells 110, being of the enhancement type, will not conduct any current from the drain to the source. Thus, $V_{out}$ would be high. On the other hand, if a positive potential is stored on the gate G of each of the EANOM cells 110, the positive voltage on gate 28 would cause each of the MOS transistors 12 to conduct current from the drain to the source. Current would then flow through resistance R and through each of the MOS transistors 12 to ground. $V_{out}$ would then be low.

It should be recognized that there are many advantages to the memory circuit 120, shown in FIG. 6. First, during the read condition, no external bias is affecting the charge on the gate G. This is because PGM 1 and PGM 2 are at the same voltage potential, namely, grounded. Thus, there is no charge gain or charge loss during the read operation. Secondly, by having two EANOM cells 110 of the present invention connected in parallel, high reliability through redundancy is achieved. In the unlikely event that the oxide layer between the third region 30 and the first electrically-conductive layer 28 ruptures, this would cause the tunnel device 14 to short. That is, G would be connected to PGM 2 and would no longer be able to hold any charge. In that event, however, since the MOS transistor 12 is of the enhancement type, a ground potential on G of the MOS transistor 12 would not cause that MOS transistor 12 to conduct current. Thus, when there is a short in the tunnel device 14, the associated MOS transistor 12 is rendered inoperative in the open circuit mode. It would be as if there were an open circuit between the drain and the source of the failed EANOM cell 110. The other EANOM cell 110, however, would continue to function and operate and, thus, the memory circuit 120 has high reliability. Of course, many EANOM cells 110 can be connected in parallel to further increase the reliability of the circuit 120.

Referring to FIG. 7, there is shown another high reliability memory circuit 150 using EANOM cells 110 of the present invention. The memory circuit 150 comprises two memory circuits 120a and 120b of the type shown and described in FIG. 6. The two memory circuits 120a and 120b are connected such that the two terminals C of the EANOM cells 110 of memory circuit 120b are connected to the two terminals T of the EANOM cells 110 of the memory circuit 120a and are then connected to PGM 1. The two terminals T of the memory circuit 120b are connected together and connected to the two terminals C of the memory circuit 120a and are then connected to PGM 2. A latch circuit 160 is connected to the resistive loads of memory circuit 120b and memory circuit 120a.

The latch circuit 160 comprises two P channel transistors 164a and 164b, and two optional resistive loads 162a and 162b. The two transistors 164a and 164b are cross-coupled. The source of each of the transistors 164a and 164b are connected to the resistance loads 162a and 162b, respectively, and are supplied by a power supply $+V$.

In the programming operation of the memory circuit 150, a potential difference is applied between PGM 1 and PGM 2. The application of a high potential would cause the gates of one pair (Pair A) of the EANOM cells 110 to be charged negative and the gates of the other pair (Pair B) of EANOM cells 110 to be charged positive. Reversal of voltage applied to PGM 1 and PGM 2 would cause the charges to be removed from the gates of the one pair of the EANOM cell 110 and charges to be placed on the gates of the other pair of EANOM cell 110. Thus, following programming, the gates of one pair of the EANOM cells 110 is charged positive, while the other pair is charged negative. This represents one logical state, such as "1". Application of a reverse potential would cause the gates of the Pair A EANOM cells to be charged positive and the gates of the other pair, Pair B, of the EANOM cells to be charged negative. This represents the other logic state, such as "0". The latch 160 detects which of the pairs of EANOM cells 110 has its gates charged. Thus, the latch 160 would then determine the logical state of the memory circuit 150.

Similar to the memory circuit 120, once programming has been accomplished, PGM 1 and PGM 2 are connected to ground potential. Suppose now the gates of the EANOM cells 110 of the memory circuit 120*b* have been charged positive, current would flow through the MOS transistors 12 of the memory circuit 120*b*. Conversely, when negative charge is stored on the gates of the EANOM cells 110 of the memory circuit 120*a*, the MOS transistor 12 associated with that memory circuit 120*a* would not conduct any current. Thus, current would begin to flow through the resistance R*b* associated with the memory circuit 120*b*. This would cause the voltage at the gate of the MOS transistor 164*a* to be lower than the voltage at the gate of the MOS transistor 164*b*. This would cause transistor 164*a* to turn on which would cause the potential at the gate of the transistor 164*b* to be pulled up even more. Transistor 164*b* would allow the voltage at its drain to fall. This is an astable condition, and the result is that the latch 160 permits $V_{out}$ to go to the potential of the power voltage and the voltage potential at the gate of the transistor 164*a* to fall to ground. Transistor 164*b* would be off and transistor 164*a* would be on. However, since there is no conductive path to ground through the EANOM cells 110 of the memory circuit 120*a*, little or no power or current is used. The analysis set forth above would reverse where the EANOMs 110 of the memory circuit 120*a* were charged positive. Similar to the memory circuit 120, the memory circuit 150, through the use of paired EANOM cells 110, has high reliability. As discussed previously, each memory circuit 120 can comprise more than two EANOM cells 110 connected in parallel.

It should be recognized that there can be many applications or uses for the EANOM cell 10 or 110 of the present invention. While the MOS transistor 12 has been described as being of the enhancement type, it should be recognized that there may be uses for the depletion type transistors. In addition, of course, P channel or N channel transistors can be used. In addition, any capacitive coupling means can be used to connect the terminal C to the gate of the MOS transistor 12.

We claim:

1. A high reliablity non-volatile memory circuit for storing charges therein comprising:
   a pair of MOS transistors, connected in parallel, each MOS transistor having a source, a drain, and a gate and is of the enhancement type in the absence of any charge on the gate;
   a pair of tunnel devices, each having two terminals and means for storing said charges;
   one of the terminals of each tunnel device is connected to one of the gates of each MOS transistor;
   the other terminals of said pair of terminal devices are connected together;
   a pair of capacitance means, each of said pair of capacitance means being capacitively coupled to the gate of each MOS transistor;
   the other terminals of said pair of capacitance means are conneted together; and
   programming means, coupled to said capacitance means and to the other terminal of each tunnel device, for placing said charges in parallel in said tunnel devices, and on the gates of said MOS transistors.

2. The circuit of claim 1 wherein each MOS transistor is N-channel type.

3. A high reliablility, low power, electrically alterable non-volatile memory circuit for storing charges therein comprising:
   two pairs of MOS transistors connected in parallel, each MOS transistor having a source, a drain and a gate and is of the enhancement type in the absence of any charge on the gate;
   two pairs of tunnel devices, each device having two terminals and means for storing said charges;
   one of the terminals of each tunnel device is connected to one of the gates of each MOS transistor;
   two pairs of capacitance means, each being capacitively coupled to the gate of each transistor;
   one pair of said capacitance means electrically connected to the other terminals of one pair of tunnel devices and the other pair of said capacitance means electrically connected to the other terminals of the other pair of tunnel terminals; and
   programming means, coupled to said one pair of said capacitance means and to the other pair of said capacitance means, for placing said charges in paralllel in said tunnel devices, and on the gates of said MOS transistors.

4. The circuit of claim 5 wherein said determining means is a latch circuit.

5. The circuit of claim 3 further comprising means for determining said charges stored in said memory circuit.

6. The circuit of claim 3 wherein each MOS transistor is N-channel type.

* * * * *